United States Patent [19]
Sysjuk et al.

[11] 4,210,569
[45] Jul. 1, 1980

[54] POLYMERIC ADHESIVE ANTIHALATION COMPOSITION FOR MAKING METAL-BACKED PHOTOPOLYMERIC PRINTING FORMS

[76] Inventors: Valentina G. Sysjuk, ulitsa Stefanika, 15, kv. 9, Lvov; Eduard T. Lazarenko, ulitsa K. Libknekhta, 2, kv. 13, Lvov; Yaroslav A. Ovdienko, ulitsa Stavropigiiskaya, 3, kv. 2, Lvov; Vladislav V. Bernatsek, ulitsa Shishkina, 20, kv. 4, Lvov; Vladislav F. Jurin, ulitsa Fedoseeva, 35, kv. 49, Lysiva Permskoi oblasti; Anatoly F. Nikolaev, ulitsa Shkolnaya, 15, kv. 42, Leningrad, all of U.S.S.R.

[21] Appl. No.: 21,360

[22] Filed: Mar. 19, 1979

[51] Int. Cl.² ............... G03C 1/84; C08K 5/07
[52] U.S. Cl. ............... 260/328 EP; 96/84 M; 430/512; 430/524
[58] Field of Search ............... 260/32.8 EP, 831; 96/84 M

[56] References Cited
U.S. PATENT DOCUMENTS

| | | | |
|---|---|---|---|
| 2,521,911 | 9/1950 | Greenlee | 260/831 |
| 3,011,909 | 12/1961 | Hart et al. | 260/328 EP |
| 3,243,376 | 3/1966 | Novick et al. | 260/84 M |
| 3,379,561 | 4/1968 | Manaka et al. | 260/831 |

FOREIGN PATENT DOCUMENTS 1142688 2/1969 United Kingdom ............... 96/84 R

*Primary Examiner*—Joseph L. Schofer
*Assistant Examiner*—Peter F. Kulkosky
*Attorney, Agent, or Firm*—Lackenbach, Lilling & Siegel

[57] ABSTRACT

An adhesive antihalation composition for making metal-backed photopolymeric printing forms, according to the invention, consists of an adhesive comprising a product of copolymerization of diphenylol-propane epoxy resin with a molecular weight from 360 to 3000 and phenol-formaldehyde novolac resin with a molecular weight from 400 to 1000 in a weight ratio of 1:1 in the product, an antihalation component - iron oxide or chromium oxide, a solvent - a mixture of ethanol and acetone, the above components being used in the composition in the following proportions (in % by weight):
antihalation component:10-15
adhesive:35-45
solvent:55-40.

This composition is simple, free from toxic substances and stable during storage. When used, it ensures high adhesion of printing elements to a metal support, as high as 300-320 kgf/cm². An adhesive antihalation layer (that is the cured adhesive antihalation composition applied to a metal support) absorbs up to 80-90% of actinic radiation in the UV spectral area thus improving quality of photopolymeric printing forms.

1 Claim, No Drawings

POLYMERIC ADHESIVE ANTIHALATION COMPOSITION FOR MAKING METAL-BACKED PHOTOPOLYMERIC PRINTING FORMS

FIELD OF THE ART

The invention relates to the polygraphic industry and more particularly, to adhesive antihalation compositions for making metal-backed photopolymeric printing forms. Such printing forms are used in relief printing on flat-bed and rotary presses, as well as in letterset and offset printing.

BACKGROUND OF THE INVENTION

Known in the art is an adhesive antihalation composition for making metal-backed photopolymeric printing forms, consisting of an antihalation component—ammonium bichromate, an adhesive—polyamide resin, a hardener—benzoyl peroxide and acrylic acid, a photoinitiator and a solvent—ethanol (cf. USSR Inventor's Certificate No. 491,119, Int. Cl. G 03 f 7/16, Official Bulletin No. 41, 1975).

This adhesive antihalation composition is only used for making printing forms from highly viscous photopolymerizable compositions on the basis of mixed polyamides.

The prior art adhesive antihalation composition cannot be used for making printing forms from liquid photopolymerizable compositions on the basis of oligoester acrylates as the adhesion of printing elements to a metal support in the finished form is low and ranges from 25 to 35 kgf/cm$^2$.

This adhesive antihalation composition is a multicomponent composition and contains toxic substances, such as acrylic acid.

SUMMARY OF THE INVENTION

It is an object of the invention to provide an adhesive antihalation composition which can be used for making printing forms for both highly viscous photopolymerizable compositions on the basis of mixed polyamides and liquid photopolymerizable compositions on the basis of oligoester acrylates, while ensuring high adhesion of printing elements to a metal support and an efficient antihalation action.

Another object of the invention is to provide an adhesive antihalation composition which is non-toxic and simple.

With these and other objects in view, the invention resides in an adhesive antihalation composition for making metal-backed photopolymeric printing forms, including an adhesive, an antihalation component and a solvent, wherein, according to the invention, the adhesive antihalation composition comprises a product of copolymerization of diphenylolpropane epoxy resin with a molecular weight from 360 to 3000 and phenol-formaldehyde novolac resin with a molecular weight from 400 to 1000 in a weight ratio of 1:1 in the product, an antihalation component—iron oxide or chromium oxide, a solvent—a mixture of ethanol and acetone in a volumetric ratio of 1:1, the above components being used in the following proportions (in % by weight):

iron oxide or chromium oxide: 10–15
product of copolymerization of diphenylol-propane epoxy resin and phenol-formaldehyde novolac resin: 35–45
mixture of ethanol and acetone: 55–40.

The adhesive antihalation composition according to the invention is simple, free from toxic substances and stable during storage. The composition is cured under mild conditions under the action of temperature without using any hardener thus reducing internal stresses appearing during the curing of composition.

The adhesive antihalation compostion according to the invention may be used for making printing forms from both highly viscous photopolymerizable compositions on the basis of mixed polyamides and liquid photopolymerizable compositions on the basis of oligoester acrylates. High adhesion of printing elements to a metal support is thereby provided, as high as 300–320 kgf/cm$^2$ (determined by the shearing method) see, e.g. Belitsky, A. Weiner et al, K voprosu opredelenija kachestva fotopolimernykh plastin. "Poligrafija," No. 10, 1976).

As shown by spectrophotometry, an adhesive antihalation layer, that is the adhesive antihalation composition applied to a metal support and cured, absorbs up to 80–90% of actinic radiation in the UV spectral area thus improving the qualitative characteristics of photopolymeric printing forms. Thus, printing forms feature a high resolution (up to 150 lines per 1 cm), high distinguishing capacity, that is the ability to reproduce the smallest independently appearing element (to 40 μm), stable trapezoidal profile of printing elements (angle at the base of printing element from 75° to 80° C.) and adequate depth of narrow and wide fittings (e.g. a fitting 0.1 mm wide is 70–80 μm deep).

DETAILED DESCRIPTION OF THE INVENTION

The adhesive antihalation composition according to the invention is prepared by dissolving in a mixture consisting of ethanol and acetone (volumetric ratio of 1:1), a copolymerization product of diphenylol-propane epoxy resin with a molecular weight from 360 to 3000 and phenol-formaldehyde novolac resin with a molecular weight from 400 to 1000 (at a weight ratio of 1:1 in the product). Then iron oxide or chromium oxide is added to the solution under stirring. The resultant mixture is thoroughly stirred to obtain a homogeneous adhesive antihalation composition. All above-described operations are conducted at room temperature (from 18° to 22° C.).

The prepared adhesive antihalation composition is applied by pouring on to a metal, e.g. steel, aluminum or copper support to form a layer from 0.1 to 0.2 mm thick. The support with the layer applied thereto is allowed to stay at 80°–100° C. for 1–2 hours, whereby the layer is cured. The metal support with the adhesive antihalation layer is used for making printing forms from both highly viscous photopolymerizable compositions on the basis of mixed polyamides and liquid photopolymerizable compositions on the basis of oligoester acrylates.

The product of copolymerization of diphenylol-propane epoxy resin and phenol-formaldehyde novolac resin used in the adhesive antihalation composition according to the invention is prepared by melting together the resins in a weight ratio of 1:1, at 120° C. for 0.5–0.2 hours (cf. N. S. Trizno, L. M. Apraksina, Z. G. Boiko, Opyt Primenenija Novykh Lakokrasochnykh Materialov v Promyshlennosti.Leningrad, 1975).

The diphenylol-propane epoxy resin used for the synthesis of the product comprises a polycondensation product of epichlorohydrin and diphenylol-propane (cf. A. A. Blagonravova, A. I. Nepomnyashchy, Varnish Epoxy Resins (in Russian), Moscow, Khimiya Publishers, 1970).

A better understanding of the invention may be had from the following specific embodiments given by way of example.

EXAMPLE 1

The following adhesive antihalation composition (in % by weight) was prepared:
iron oxide: 10
product of copolymerization of diphenylol-propane epoxy resin with a molecular weight from 360 to 470 and phenol-formaldehyde novolac resin with a molecular weight from 400 to 600 (weight ratio of the resins in the product 1:1): 35
mixture of ethanol and acetone (volumetric ratio 1:1): 55.

For that purpose, a product of copolymerization of diphenylol-propane epoxy resin and phenol-formaldehyde novolac resin was dissolved at 18°–22° C. in a mixture of ethanol and acetone. Then iron oxide was added to the resultant solution. The resultant mixture was thoroughly stirred to obtain a homogeneous adhesive antihalation composition.

The resultant adhesive antihalation composition was applied by pouring on to a steel support to form a layer 0.1 mm thick. The support with the layer applied thereto was allowed to cure at 100° C. for one hour.

The steel support coated with the adhesive antihalation composition was used for making a printing form of a liquid photopolymerizable composition. The following liquid photopolymerizable composition was used (in % by weight):
methyl methacrylate:10
benzoin:0.5
oligoester acrylate on the basis of methacrylic acid, diethylene glycol and phthalic anhydride with an average degree of polycondensation of 2:89.5.

For making a printing form, the steel support with the adhesive antihalation layer applied thereto was placed on a magnetic pad of a forming and print-down frame. A screen frame was placed on the steel support and covered with a glass with a negative glued thereto. The above-described liquid photopolymerizable composition was poured into the space between the steel support and the glass. The form was exposed using luminescent UV-lamps of 80 W total output. Nonexposed portions were removed with 1% aqueous solution of sodium bicarbonate.

As a result, a finished photopolymeric printing form was obtained, the adhesion of printing elements to the steel support being 240 kgf/cm$^2$ (by the shearing method). As shown by spectrophotometry; the adhesive antihalation layer absorbed 83% of actinic radiation in the UV spectral area. The printing form had high qualitative characteristics, namely: resolution of 120 lines per 1 cm, distinguishing capacity 50 μm, angle at the base of printing element 75°; depth of a fitting 0.1 mm wide 70 μm.

EXAMPLE 2

The following adhesion antihalation composition (in % by weight) was prepared:
iron oxide:15
product of copolymerization of diphenylol-propane epoxy resin with a molecular weight from 1100–1225 and phenol-formaldehyde novolac resin with a molecular weight from 670 to 800 (weight ratio of the resins in the product 1:1):45
mixture of ethanol and acetone (volumetric ratio 1:1):40.

The resultant adhesive antihalation composition was applied by pouring on to a steel support to form a layer 0.15 mm thick. The support with the applied layer was allowed to cure at 80° C. for two hours. Then a printing form was prepared as described in Example 1 using the following liquid photopolymerizable composition (in % by weight):
polyethylene glycol dimethacrylate:5
benzoin methylate:1
oligoester on the basis of methacrylic acid, triethylene glycol and phthalic anhydride with average degree of polycondensation 1:94.

The resultant printing form exhibited adhesion to a steel support of 290 kgf/cm$^2$. The adhesive antihalation layer absorbed 88% of actinic radiation in the UV spectral area. The printing form had a resultion of 150 lines per 1 cm, distinguishing capacity of 40 μm, angle at the base of printing element 78° and depth of a fitting 0.1 mm wide 80 μm.

EXAMPLE 3

The following adhesive antihalation composition was prepared as described in Example 1 (in % by weight):
chromium oxide:12.5
product of copolymerization of diphenylol-propane epoxy resin with a molecular weight from 2840 to 3000 and phenol-formaldehyde novolac resin with a molecular weight from 870 to 1000 (at a weight ratio of the resins in the product 1:1):40
mixture of ethanol and acetone (1:1):47.5.

The resultant adhesive antihalation composition was applied by pouring on to an aluminum support to form a layer 0.2 mm thick. The support with the applied layer was allowed to stay at 90° C. for 1.5 hours for curing of the applied layer.

A photopolymeric printing form was prepared as described in Example 1. The difference resided in that the aluminum support with the adhesive antihalation layer applied thereto was placed on a plastic pad by means of two-sided adhesive tape, rather than by means of a magnetic pad.

Adhesion of printing elements to the aluminium support was 260 kgf/cm$^2$. The adhesive antihalation layer absorbed 90% of the actinic radiation in the UV spectral area.

EXAMPLE 4

The following adhesive antihalation composition was prepared as described in Example (in % by weight):
chromium oxide:10
product of copolymerization of diphenylolpropane epoxy resin with a molecular weight from 1100 to 1225 and phenol-formaldehyde novolac resin with a molecular weight from 400 to 600 (with the weight ratio of the resins in the product 1:1):45
mixture of ethanol and acetone (1:1):45

The resultant adhesive antihalation composition was applied by pouring on to a steel support to form a layer 0.15 mm thick. The support with the applied layer was allowed to cure at 80° C. for one hour.

The steel support with the adhesive antihalation composition was used for making a printing form from a highly viscous photopolymerizable composition. This highly viscous photopolymerizable composition contained: polyamide resin (a 25% ethanol solution of hexamethylenediamine adipate, hexamethylenediamine sebacate and
2-caprolactam in a ratio of 37:19:44), ml.:75
ethanol, ml.:225
acrylic acid, ml.:40
ethylene glycol dimethacrylate, ml.:15
benzoin, g.:1
benzophenone, g.:0.6
methylene blue, g.:0.006
hydroquinone, g.:0.30.

For making a printing form, the steel support with the adhesive antihalation layer was fixed to a drum of a rotary coating machine. The above-described highly viscous photopolymerizable composition was fed from a batcher to the fixed support. The applied layer of the photopolymerizable composition was distributed over the support by means of a doctor blade with the clearance between the support and doctor blade of 0.2 mm. Then the doctor blade was set for 0.4 mm clearance, and the application of the photopolymerizable composition was repeated. Subsequently, an exposure was effected using luminescent-UV-lamps of 80 W total output. Nonexposed portions were removed with 75% aqueous solution of ethanol.

As a result, a finished photopolymeric printing form was obtained, the adhesion of printing elements to the steel support being 320 kfg/cm$^2$ (by the shearing method). As shown by spectrophotometry, the adhesive antihalation layer absorbed 80% of actinic radiation in the UV spectral area. The printing form exhibited high quality similar to that described in Example 1.

EXAMPLE 5 (for comparison)

A known adhesive antihalation composition was used, containing:
polyamide resin (a 25% ethanol solution of hexamethylenediamine adipate, hexamethylenediamine sebacate and $\epsilon$-caprolactam in a ratio of 37:19:44), ml.:375
ethanol, ml.:1125
acrylic acid, ml.:300
benzoyl peroxide, g.:4
benzoin, g.:3
ammonium bichromate, g.:5.

This composition was applied by pouring on to a steel support to form a layer 0.15 mm thick. The support with the applied layer was heated at 30°–40° C. for 10 minutes and then, at 80° for 20 minutes. The layer was then subjected to UV-radiation for 30 minutes using luminescent lamps of 80 W total output. After the above-described operations, the composition applied to the support was cured to form an adhesive antihalation layer.

The steel support with the applied adhesive antihalation layer was used for making a printing form from a liquid photopolymerizable composition on the basis of oligoester acrylates. The photopolymeric printing form was prepared as described in Example 1.

Adhesion of printing elements to the support determined by the shearing method was 35 kgf/cm$^2$ which was unacceptable for printing (acceptable adhesion value is from 160 to 170 kgf/cm$^2$). The adhesion antihalation layer absorbed 70% of actinic radiation in the UV spectral area.

We claim:
1. As adhesive antihalation composition for making metal-backed photopolymeric printing forms, consisting of the following components:
an adhesive comprising a product of copolymerization of diphenylol-propane epoxy resin with a molecular weight from 360 to 3000 and phenol-formaldehyde novolac resin with a molecular weight from 400 to 1000 in a weight ratio of 1:1 in the product;
an antihalation component selected from the group consisting of iron oxide and chromium oxide;
a solvent comprising a mixture of ethanol and acetone in a volumetric ratio of 1:1;
said components being used in the composition in the following proportions (in % by weight):
antihalation component: 10–15
adhesive: 35–45
solvent: 55–40.

* * * * *